US009401590B2

(12) United States Patent
Horowy et al.

(10) Patent No.: US 9,401,590 B2

(45) Date of Patent: Jul. 26, 2016

(54) HEAT SINK FOR CONTACTOR IN POWER DISTRIBUTION ASSEMBLY

(71) Applicant: Hamilton Sundstrand Corporation, Windor Locks, CT (US)

(72) Inventors: John Horowy, Rockford, IL (US); Debabrata Pal, Hoffman Estates, IL (US); Eric Karlen, Rockford, IL (US); Rainer J. Seidel, Tussenhausen (DE)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 58 days.

(21) Appl. No.: 14/194,949

(22) Filed: Mar. 3, 2014

(65) Prior Publication Data

US 2015/0194797 A1 Jul. 9, 2015

Related U.S. Application Data

(60) Provisional application No. 61/923,963, filed on Jan. 6, 2014.

(51) Int. Cl.

| | |
|---|---|
| ***H02G 5/10*** | (2006.01) |
| ***B29C 67/00*** | (2006.01) |
| ***H02B 1/056*** | (2006.01) |
| ***H05K 7/20*** | (2006.01) |
| *B33Y 10/00* | (2015.01) |
| *B33Y 70/00* | (2015.01) |
| *B33Y 80/00* | (2015.01) |

(Continued)

(52) U.S. Cl.

CPC .............. *H02G 5/10* (2013.01); *B29C 67/0051* (2013.01); *H02B 1/056* (2013.01); *H05K 7/209* (2013.01); *B29K 2105/0002* (2013.01); *B29L 2031/3493* (2013.01); *B33Y 10/00* (2014.12); *B33Y 70/00* (2014.12); *B33Y 80/00* (2014.12); *H02B 1/56* (2013.01)

(58) Field of Classification Search

CPC ... H05K 3/4608; H05K 1/0201; H05K 1/021; H02G 5/10

USPC ....................................... 174/16.2, 16.3, 260

See application file for complete search history.

(56) References Cited

U.S. PATENT DOCUMENTS

| | | | |
|---|---|---|---|
| 6,538,878 | B1 | 3/2003 | Acker et al. |
| 7,837,496 | B1 | 11/2010 | Pal |

(Continued)

FOREIGN PATENT DOCUMENTS

| | | | |
|---|---|---|---|
| EP | 2355638 | A2 | 8/2011 |
| EP | 2530823 | A1 | 12/2012 |

OTHER PUBLICATIONS

Extended European Search Report for Application No./Patent No. EP 14 19 4711.9 dated Jul. 10, 2015; Mailed Jul. 17, 2015; 5 pages.

*Primary Examiner* — Chau N Nguyen

(74) *Attorney, Agent, or Firm* — Cantor Colburn LLP

(57) ABSTRACT

An electrical contactor assembly is provided including an electrical bus bar and at least one electrical contactor. The electrical bus bar includes a layer of insulation, a layer of copper, and a composite core having at least one wire embedded therein. The wire is configured to locally reduce thermal strain. The at least one electrical contactor is mounted to the layer of copper through an opening in the layer of insulation. The electrical contactor and the bus bar are thermally and electrically connected.

11 Claims, 6 Drawing Sheets

(51) Int. Cl.
*B29K 105/00* (2006.01)
*B29L 31/34* (2006.01)
*H02B 1/56* (2006.01)

(56) References Cited

U.S. PATENT DOCUMENTS

2006/0237225 A1* 10/2006 Kariya et al. ................. 174/260
2007/0012477 A1* 1/2007 Nakamura et al. ............ 174/260
2007/0119617 A1* 5/2007 Hayashi et al. ............... 174/260
2009/0161301 A1 6/2009 Woody et al.
2010/0065307 A1* 3/2010 Nagase et al. ................ 174/252
2012/0012153 A1* 1/2012 Azechi et al. ................. 136/244

* cited by examiner

HEAT SINK FOR CONTACTOR IN POWER DISTRIBUTION ASSEMBLY

CROSS-REFERENCE TO RELATED APPLICATION

This application claims the benefit of U.S. provisional patent application Ser. No. 61/923,963 filed Jan. 6, 2014, the entire contents of which are incorporated herein by reference.

BACKGROUND OF THE INVENTION

This invention generally relates to the field of electrical contactors and, more particularly, to a bus bar configured to dissipate heat generated by an electrical contactor of a contactor assembly.

Contactor assemblies are used in electrical applications, such as aircraft power distribution systems, where power and current flow control of a multi-phase power distribution system is required. A contactor assembly typically includes a panel on which several electrical contactors are mounted. Known mounting assemblies used to mount electrical contactors to the panels are constructed of thermally and electrically resistive materials, such as plastics.

Each of the contactors is connected to an electrical bus bar, and allows current to flow through the contactor and the corresponding bus bar whenever the contactor is in a closed position. The electrical power and current flow through the contactors is controlled by mechanically actuating a contact plate within the contactor such that, when current flow is desired to pass through the contactor, the contact plate is pushed into electrical contact with two leads and forms an electrical path coupling the leads, thereby allowing current to flow through it.

Due to the amount of current traveling from the leads to the contact plate, the temperature of the electrical contactors and of the bus bar coupled thereto increases. Because the electrical contactors and the bus bar are made from different materials, the increase in temperature causes the contactors and the bus bar to expand at different rates, creating thermal strain and fracturing in the contactor assembly.

BRIEF DESCRIPTION OF THE INVENTION

According to one embodiment of the invention, an electrical contactor assembly is provided including an electrical bus bar and at least one electrical contactor. The electrical bus bar includes a layer of insulation, a layer of copper, and a composite core having at least one wire embedded therein. The wire is configured to locally reduce thermal strain. The at least one electrical contactor is mounted to the layer of copper through an opening in the layer of insulation. The electrical contactor and the bus bar are thermally and electrically connected.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
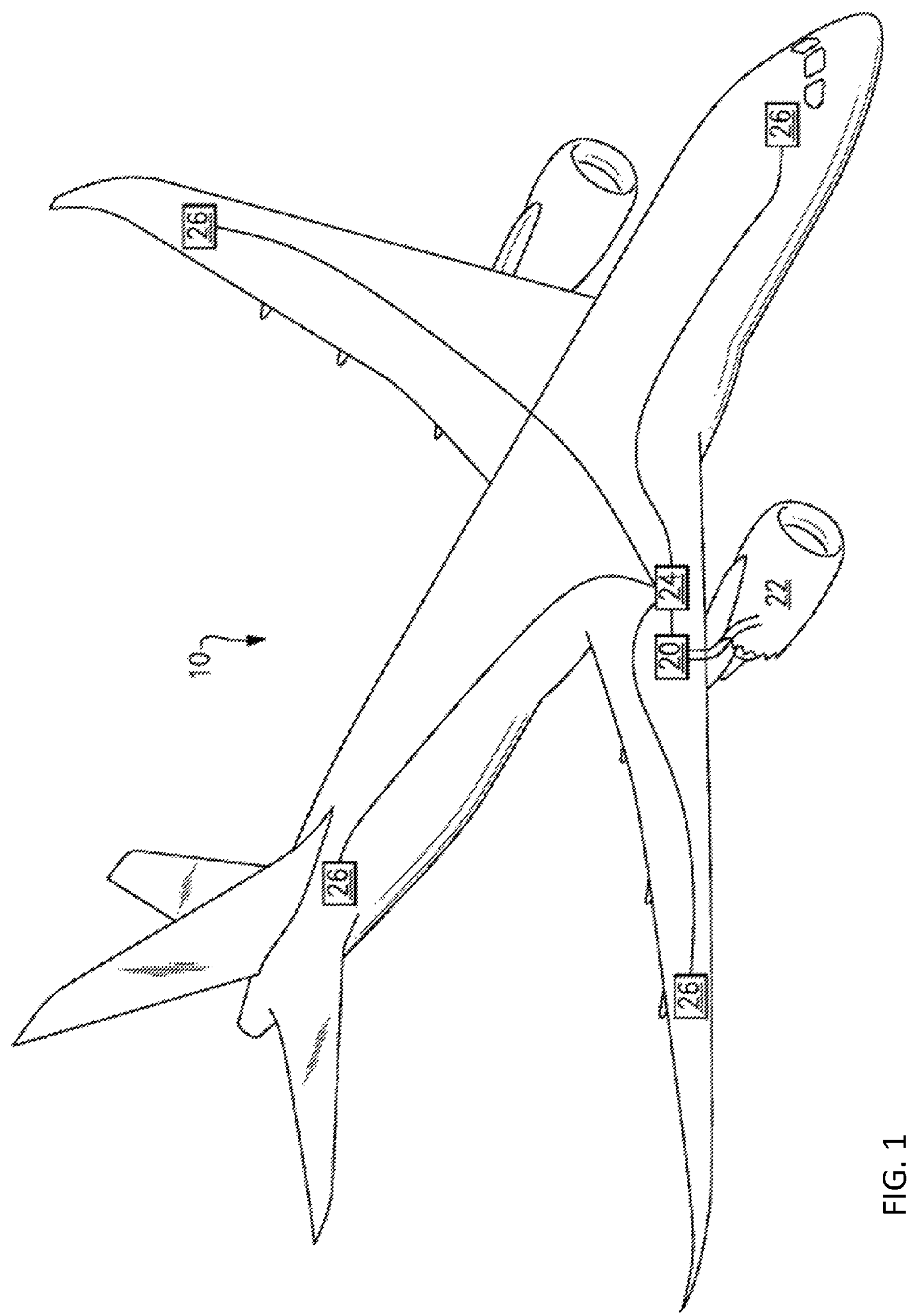
FIG. 1 is a schematic diagram of an aircraft.

Referring now to FIG. 1, an example of an aircraft 10 including an electrical power distribution system is illustrated. The aircraft 10 includes a power generation system 20, which utilizes rotation within the jet engines 22 to generate either single phase or three phase electrical power. The power is sent to a panel box 24 that contains multiple electrical buses and contactor assemblies 100 for controlling how the power is distributed throughout the aircraft 10. Through the use of the electrical contactor assemblies 100, power may be controlled for each onboard electrical system 26 independently.

Figure 2:
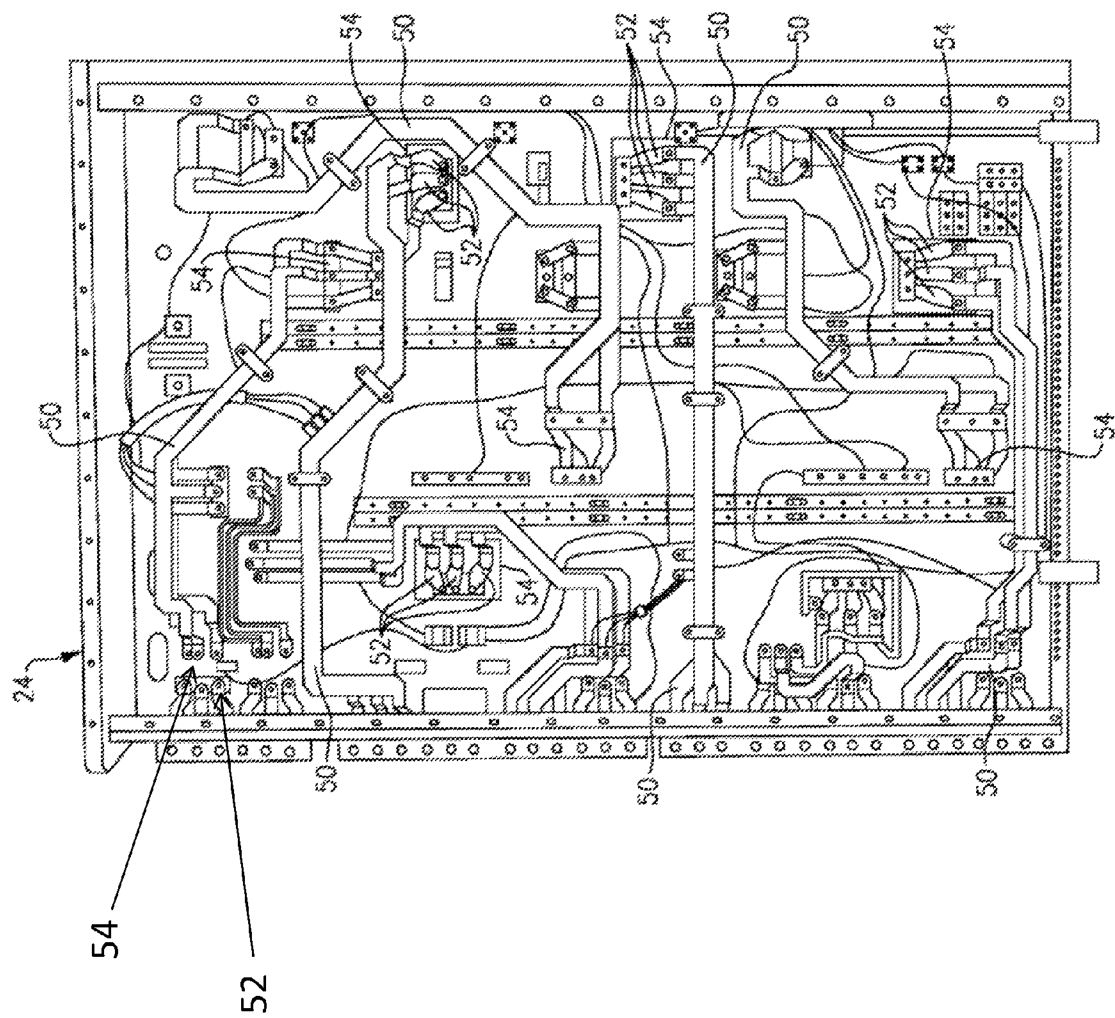
FIG. 2 is a schematic diagram of a portion of an exemplary power distribution network.
Figure 3A:
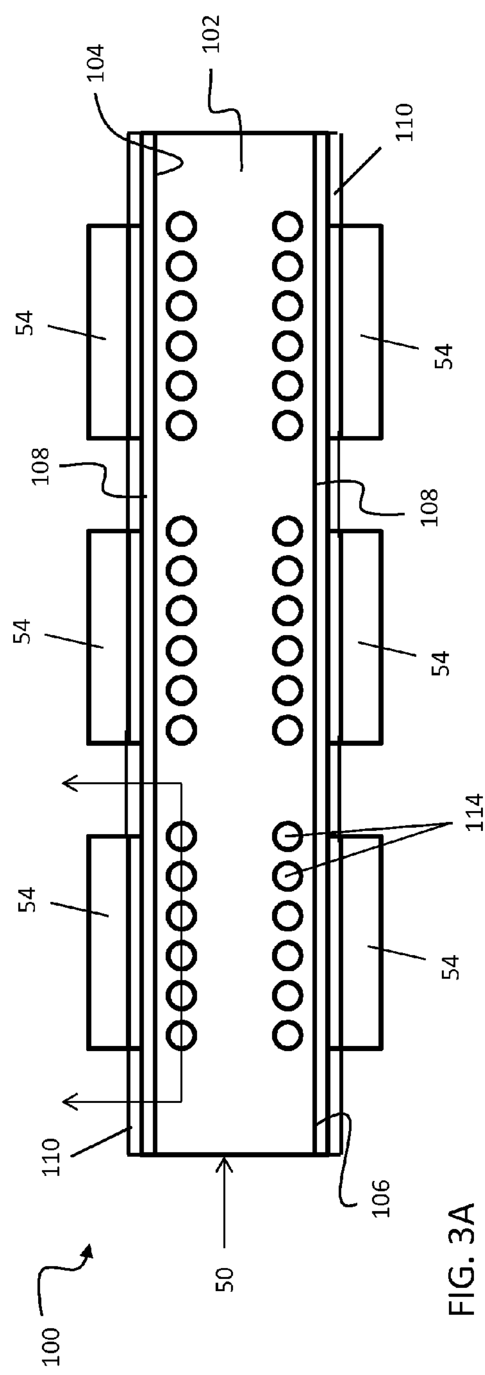
FIG. 3A is a cross-sectional view of a contactor assembly in a power distribution network according to an embodiment of the invention.
Figure 3B:
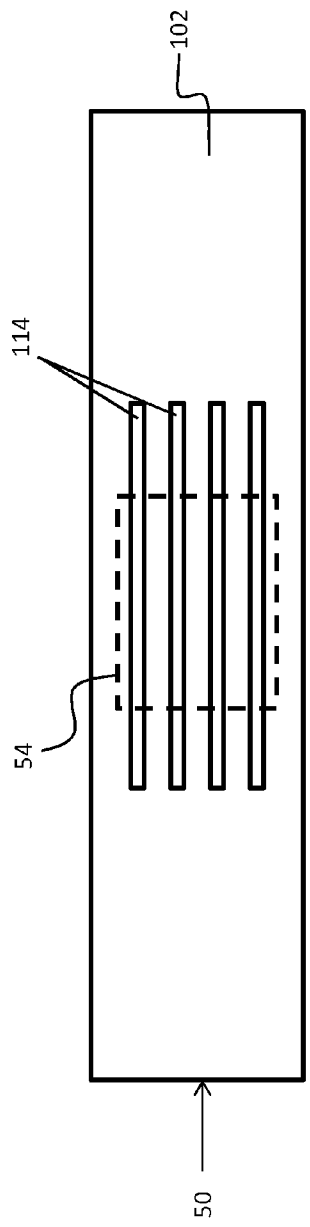
FIG. 3B is a top view of a contactor assembly in a power distribution network according to an embodiment of the invention.
Figure 4A:
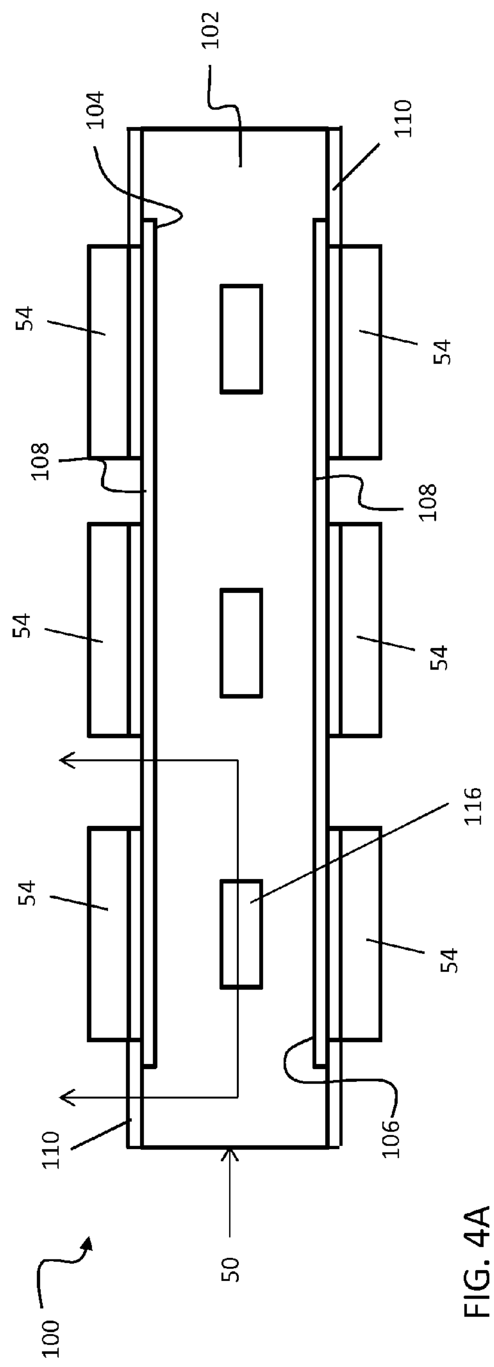
FIG. 4A is a cross-sectional view of a contactor assembly in a power distribution network according to an embodiment of the invention.
Figure 4B:
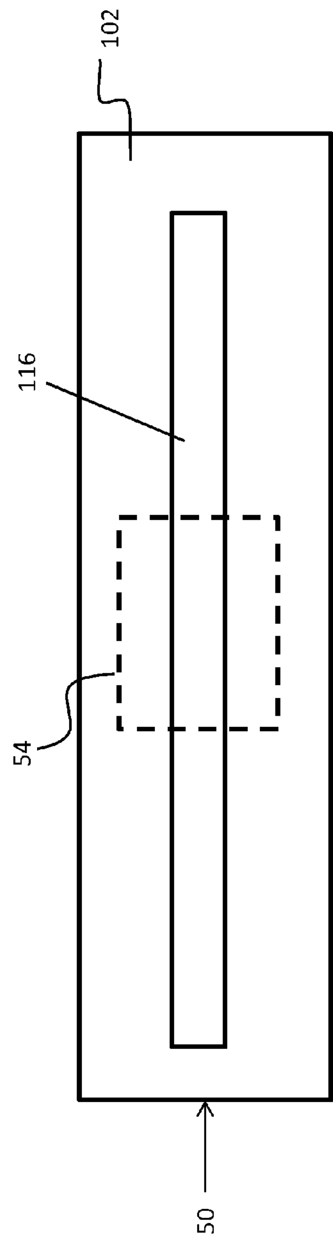
FIG. 4B is a top view of a contactor assembly in a power distribution network according to an embodiment of the invention.

The interior of an example of a panel box 24 is illustrated in FIG. 2. The interior of the panel box 24 has multiple electrical bus bars 50, which are interrupted by electrical contactor connections 52. When the contactor connections 52 are closed, electrical current and heat are allowed to flow between the connected bus bars 50 and a contactor 54. The contactor 54 is an electrical switch, such as a silicon die for an electronic component, such as a field effect transistor (FET) for example. In known systems, all of the excess heat generated in the contactors 54 is transmitted to the bus bars 50 for dissipation by convection and radiation into the ambient atmosphere.

Referring now to FIGS. 3-6, an example of a contactor assembly 100 for connecting an electrical contactor 54 to a bus bar 50 is illustrated. The generally rectangular bus bar 50 includes a core 102 formed from a plurality of layers of thermally and electrically conductive materials. In one embodiment, the bus bar core 102 includes layers of aluminum and graphene arranged in an alternating configuration. The size and number of layers, as well as the materials used to form the core 102 depend on the application and the amount of current that the bus bar 50 is intended to carry. A layer of copper 108 is positioned over both a first surface 104 and a second, opposite surface 106 of the core 102. Overlapping each of the copper layers 108, is a layer of insulation 110 having one or more openings 112 formed therein. Each of the openings 112 (FIG. 6) in the insulation 110 corresponds to a position where a contactor 54 is configured to be mounted to the bus bar 50. In one embodiment, the core 102, layers of copper 108 and layers of insulation 110 of the bus bar 50 are formed via an additive manufacturing process.

A plurality of wires 114 (FIGS. 3A and 3B) extend over at least a portion of the length of the bus bar 50, through a central portion of the core 102. The wires 114 may be formed from a memory metal, such as Nitinol for example, and are configured to locally reduce thermal strain by counteracting the effects of thermal expansion of the contactors 54. In one embodiment, the wires 114 are arranged in groups substantially aligned with the contactors 54 connected to the bus bar 50. In the illustrated, non-limiting embodiment, the groups of wires 114 are arranged near the surface of the core, either the first surface 104 or the second surface 106, closest to a contactor 54. The length and diameter of each wire 114, as well as the number of wires 114 within in a group may vary based on the application and the coefficient of thermal expansion of the materials in the assembly 100. One or more heat pipes 116 (FIGS. 4A and 4B) may also be arranged within the core 102 of the bus bar 50. The heat pipes 116 are configured to draw heat away from the contactor assembly 100. In one embodiment, a heat pipe 116 is arranged generally in the center of the bus bar 50 in alignment with a contactor 54 mounted thereto.

Figure 5:
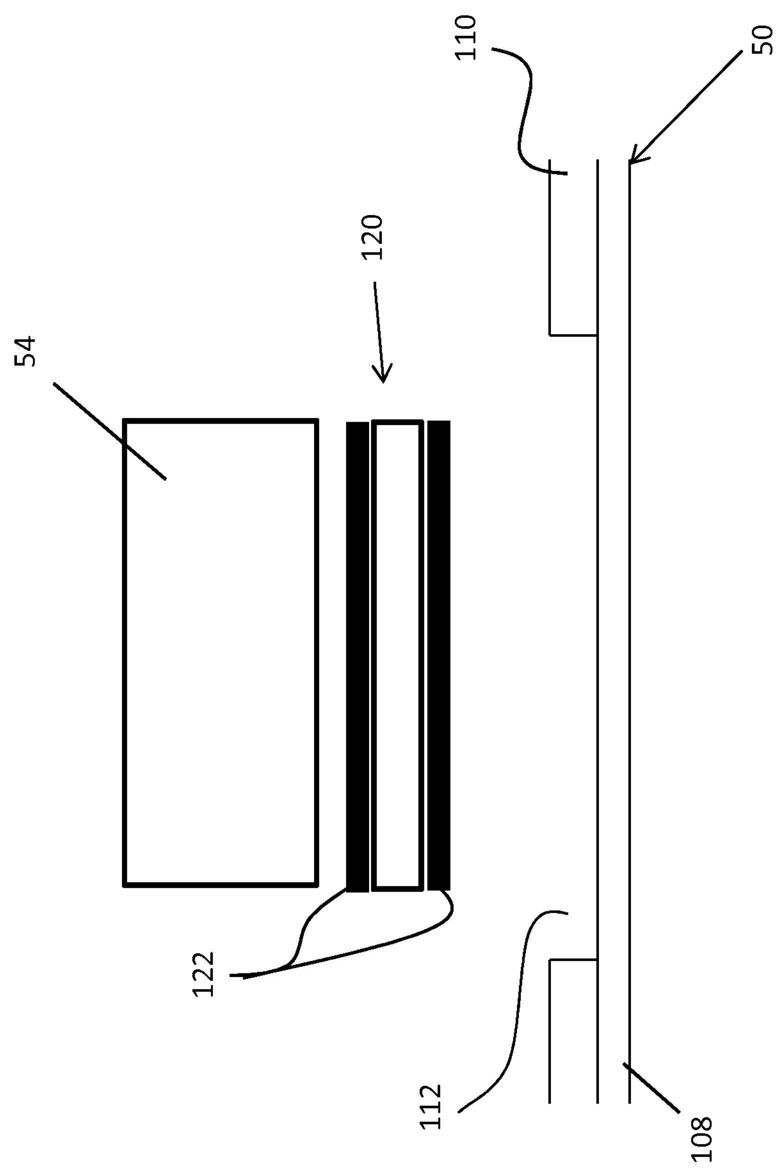
FIG. 5 is a cross-sectional view of a contactor assembly in a power distribution network according to an embodiment of the invention.
Figure 6:
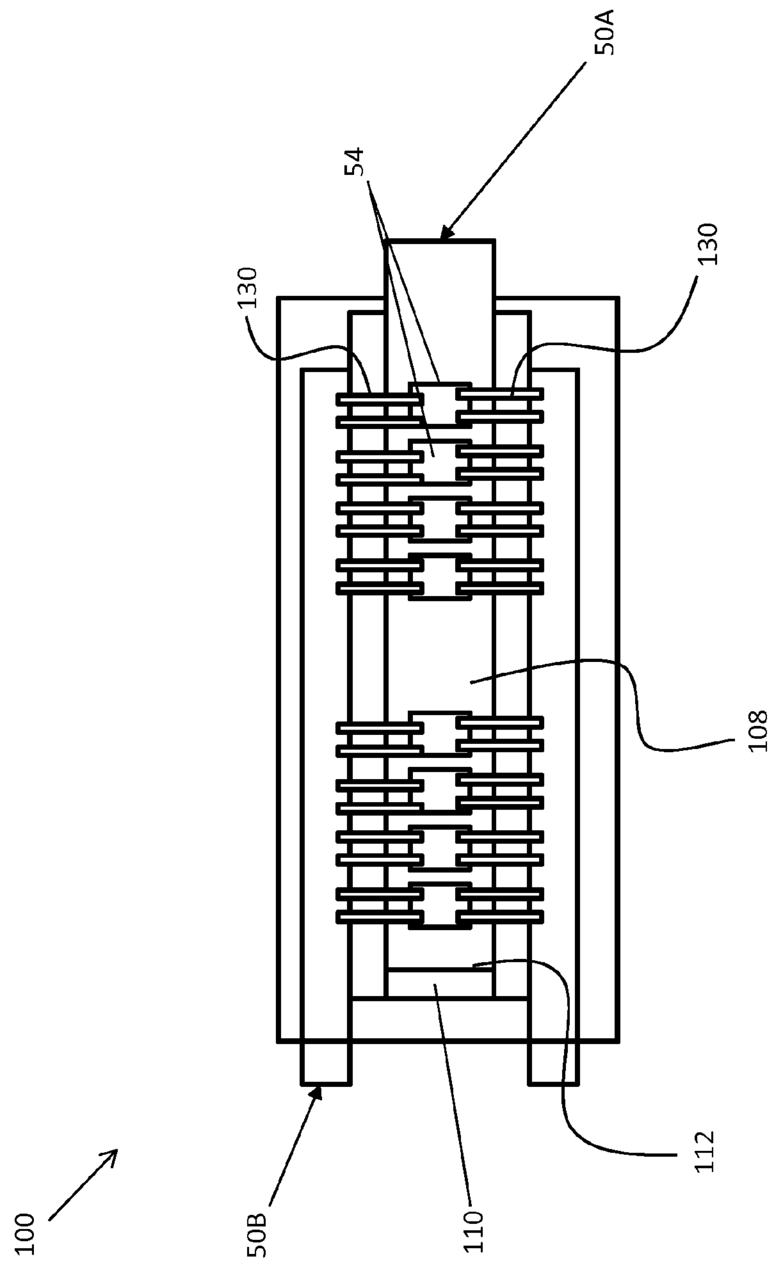
FIG. 6 is a top view of a contactor assembly according to another embodiment of the invention.

Referring now to FIG. 5, a solder plated nanofoil 120 is used to electrically and thermally couple each contactor 54, positioned within an opening 112 in the insulation 110, to a copper layer 108 of the bus bar 50. Application of an electrical current to the nanofoil 120 causes the solder 122 to melt and bond with both the copper layer 108 and the contactor 54. The fusible nature of the solder 122 reduces the likelihood of cracks or fractures as a result of the difference between the coefficient of thermal expansion of the bus bar 50 and of the contactor 54. A plurality of bond wires 130 (FIG. 6) electrically couple the contactor 54 to another a bus bar. The bond wires 130 may be conventional wires, or alternatively may be formed from electrically conductive ink, such as through a direct write 3-D printing process for example. During operation current flows from bus bar 50A to the contactor 54, through the bond wire 130 and over to the second bus bar 50B. Current flow through the contactor 54 is controlled electronically by a bus power control circuit (not shown) which can turn the contactor 54 on or off electronically depending on the operating condition.

The contactor assembly 100 described herein has a reduced number of thermal interfaces, and therefore has an improved performance and reliability. Utilizing direct write technology for the bond wires 130, any parasitic effects generated by positioning the contactors 54 flat on the bus bar 50 is eliminated. The memory wires within the bus bar core 102 provide a method of controlling the strain caused by thermal mismatch between the contactor 54 and bus bar 50 and thereby reduce the damage caused by the thermal cycles experienced in operation. This will result in contactor having higher thermal cycling capability. In addition, because the metered deposition and the material conductivity is known, the direct write bond wires 130 may be used as a safety device to disable the contactor assembly in the event of a failure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An electrical contactor assembly comprising:

an electrical bus bar including a layer of insulation, a layer of copper, and a composite core including at least one wire embedded therein, and at least one electrical contactor mounted to the layer of copper through an opening in the layer of insulation such that the electrical contactor and the bus bar are thermally and electrically connected, wherein the at least one wire is configured to temporarily deform to counteract thermal expansion of the at least one electrical contactor;

wherein the composite core is formed from a plurality of aluminum layers and a plurality of graphene layers; and wherein the plurality of aluminum layers and the plurality of graphene layers alternate.

2. The electrical contactor assembly according to claim 1, wherein the bus bar is formed by an additive manufacturing process.

3. The electrical contactor assembly according to claim 1, wherein the at least one wire is a formed from a memory metal.

4. The electrical contactor assembly according to claim 3, wherein a plurality of wires are embedded in the composite core, the plurality of wires are arranged into groups generally aligned with the at least one electrical contactor.

5. The electrical contactor assembly according to claim 4, wherein the plurality of wires is positioned near a surface of the core adjacent the electrical contactor.

6. The electrical contactor assembly according to claim 1, further comprising at least one heat pipe embedded within the composite core of the bus bar.

7. The electrical contactor assembly according to claim 6, wherein the at least one heat pipe is generally aligned with one of the at least one electrical contactors.

8. The electrical contactor assembly according to claim 7, wherein the at least one heat pipe is positioned generally centrally within the composite core.

9. The electrical contactor assembly according to claim 1, wherein the electrical contactor is mounted to the bus bar with a solder plated nanofoil.

10. An electrical contactor assembly comprising:

an electrical bus bar including a layer of insulation, a layer of copper, and a composite core including at least one wire embedded therein, and at least one electrical contactor mounted to the layer of copper through an opening in the layer of insulation such that the electrical contactor and the bus bar are thermally and electrically connected, wherein the at least one wire is configured to temporarily deform to counteract thermal expansion of the at least one electrical contactor;

at least one bond wire configured to electrically couple the electrical contactor to a power source, wherein the at least one bond wire includes an electrically conductive ink.

11. The electrical contactor assembly according to claim 10, where the at least one bond wire is formed by a direct write 3-D printing process.

* * * * *